United States Patent
Bruwer et al.

[11] Patent Number: 6,058,294
[45] Date of Patent: May 2, 2000

[54] ADJUSTABLE FREQUENCY STABILIZING INTERNAL CHIP CAPACITOR SYSTEM

[75] Inventors: Frederick J. Bruwer; Willem Smit, both of Chandler, Ariz.

[73] Assignee: Microchip Technology Incorporated, Chandler, Ariz.

[21] Appl. No.: 09/047,779

[22] Filed: Mar. 24, 1998

[51] Int. Cl.$^7$ ................. H04B 1/02; H04R 1/02
[52] U.S. Cl. ............. 455/119; 455/120; 455/123; 455/124; 455/125; 327/334; 327/337; 307/109; 307/125
[58] Field of Search ..................... 455/119, 120, 455/123, 124, 125; 327/334, 337, 113; 307/109, 125, 130

[56] References Cited

U.S. PATENT DOCUMENTS

| | | | |
|---|---|---|---|
| 4,684,853 | 8/1987 | Coash .......................................... | 318/16 |
| 4,794,622 | 12/1988 | Ksaacman et al. ...................... | 455/119 |
| 4,814,640 | 3/1989 | Miyake . | |
| 4,864,636 | 9/1989 | Brunius ..................................... | 455/119 |
| 5,027,429 | 6/1991 | Kojima ....................................... | 455/119 |
| 5,285,997 | 2/1994 | Fraser et al. ............................. | 455/119 |
| 5,473,526 | 12/1995 | Svensson et al. ........................ | 307/109 |
| 5,552,748 | 9/1996 | O'Shaughnessy . | |
| 5,740,522 | 4/1998 | Dolman et al. .......................... | 455/119 |
| 5,818,880 | 10/1998 | Kriz et al. ................................. | 455/124 |
| 5,880,538 | 3/1999 | Schulz ....................................... | 307/109 |
| 5,982,242 | 11/1999 | Jun et al. ................................... | 455/119 |

FOREIGN PATENT DOCUMENTS

| | | |
|---|---|---|
| 0 431 887 | 6/1991 | European Pat. Off. . |
| WO 98/08299 | 2/1998 | WIPO . |

*Primary Examiner*—Fan S. Tsang
*Assistant Examiner*—Simon Nguyen
*Attorney, Agent, or Firm*—Ronald L. Chichester; Paul N. Katz; Frohwitter

[57] ABSTRACT

A transmitter system having an adjustable monolithic frequency stabilization and tuning internal capacitor circuit. The transmitter system has a transmitter for generating and transmitting a transmitter oscillator frequency signal. A data generating chip is coupled to the transmitter. The data generating chip is used for adjusting and controlling the transmitter oscillator frequency signal. A variable capacitor circuit is located internal to the data generating chip and is coupled to a ground pin and one of a plurality of function pins on the data generating chip. The variable capacitor circuit is used for adjusting and setting the centerpoint of the transmitter oscillator frequency signal.

19 Claims, 3 Drawing Sheets

ADJUSTABLE FREQUENCY STABILIZING INTERNAL CHIP CAPACITOR SYSTEM

BACKGROUND OF THE INVENTION

1. Field of the Invention

This invention relates generally to transmitters, and more specifically, to an internal adjustable capacitor for a transmitter system which will allow a user to easily adjust and/or set the centerpoint of the transmitter oscillator frequency.

2. Background of the Invention

For transmitter and receiving devices such as a remote activated garage door openers or remote activated car alarms, a transmitter will send a signal at a desired frequency to the receiver. The transmitter oscillator frequency must match the setting in the receiver. If the frequency of the transmitter is a little off, the receiver/transmitter devices will not operate or will not operate at long distances.

Presently, most RF transmitters have an external capacitor which is coupled to the RF transmitter. The external capacitor is a tunable capacitor which is used to set the centerpoint of the transmitter oscillator frequency. The problem with external capacitors is that they are expensive to implement. This is due to the fact that each capacitor has to be individually trimmed to the desired setting for each transmitter. Furthermore, once the external capacitor is set, the capacitor is generally sealed in wax or some other substance. Thus, once set, the external capacitor is difficult to adjust and retune if the transmitter oscillator frequency has shifted or was not properly set at manufacture.

Therefore, a need existed to provide an improved transmitter/receiver system. The improved transmitter/receiver system will have a transmitter system which is capable of adjusting and setting the transmitter oscillator frequency. The transmitter system will have a tunable internal capacitor for setting the centerpoint of the transmitter oscillator frequency.

SUMMARY OF THE INVENTION

In accordance with one embodiment of the present invention, it is an object of the present invention to provide an improved transmitter/receiver system.

It is another object of the present invention to provide an improved transmitter/receiver system which will have a transmitter system which is capable of adjusting and setting the transmitter oscillator frequency.

It is still another object of the present invention to provide an improved transmitter/receiver system which has a transmitter system which is capable of adjusting and setting the transmitter oscillator frequency wherein the transmitter system will have a tunable internal capacitor for setting the centerpoint of the transmitter oscillator frequency.

BRIEF DESCRIPTION OF THE PREFERRED EMBODIMENTS

In accordance with one embodiment of the present invention, an adjustable frequency stabilization internal chip system is disclosed. The system has a transmitter for generating and transmitting a transmitter oscillator frequency signal. A data generating chip is coupled to the transmitter and has a plurality of function pins. The data generating chip is used for adjusting and controlling the transmitter oscillator frequency signal. A variable capacitor circuit is located internal to the data generating chip and is coupled to a ground pin and one of the plurality of function pins of the data generating chip. The internal capacitor circuit is used for adjusting and setting a centerpoint of the transmitter oscillator frequency signal.

In accordance with another embodiment of the present invention, a transmitter system is disclosed. The transmitter system has a transmitter for generating and transmitting a transmitter oscillator frequency signal. A data generating chip is coupled to the transmitter and has a plurality of function pins. The data generating chip is used for adjusting and controlling the transmitter oscillator frequency signal. A variable capacitor circuit is located internal to the data generating chip and is coupled to a ground pin and one of the plurality of function pins of the data generating chip. The variable capacitor circuit is used for adjusting and setting a centerpoint of the transmitter oscillator frequency. The variable capacitor circuit is generally comprised of a plurality of capacitor banks. A tuning circuit is coupled to the plurality of capacitor banks of the variable capacitor circuit for activating and deactivating each of the plurality of capacitor banks in order to adjust and set the variable capacitor circuit. A pull-up biasing circuit is coupled to the variable capacitor circuit for preventing a negative voltage swing and for preventing floating nodes. A switching circuit is coupled to each of the plurality of capacitor banks of the variable capacitor circuit and to the tuning circuit. The switching circuit is used for receiving a setting from the tuning circuit and for switching on and switching off each of the plurality of capacitor banks based on the setting from the tuning circuit thereby adjusting and setting the variable capacitor circuit to the proper centerpoint transmitter oscillator frequency.

The foregoing and other objects, features, and advantages of the invention will be apparent from the following, more particular, description of the preferred embodiments of the invention, as illustrated in the accompanying drawing.

DETAILED DESCRIPTION OF THE PREFERRED EMBODIMENTS

Figure 1:
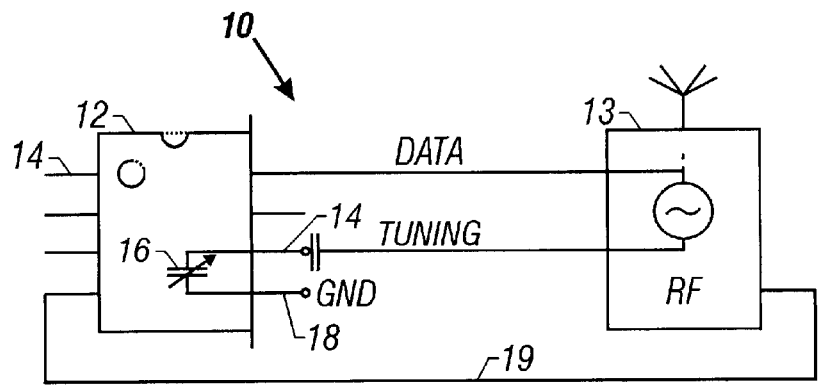
FIG. 1 is a simplified block diagram of the adjustable internal capacitor transmitter system of the present invention.

Referring to FIG. 1, an adjustable frequency transmitter system 10 (hereinafter system 10) is shown. The system 10 will allow the user of an RF transmitter device such as a garage door opener or a remote activated car alarm device to easily adjust and set the centerpoint frequency of the transmitter. The system 10 is comprised of two main components: a data generating chip 12 and an RF transmitter 13. The RF transmitter 13 is used to generate, amplify and transmit a transmitter oscillator frequency to a receiver (not shown). The data generating chip 12 is coupled to the RF transmitter 13. The data generating chip 12 is used to adjust and control the transmitter oscillator frequency of the RF transmitter 13 and is also used for supplying data to modulate the transmitter oscillator frequency. The data generating chip may use two different methods to adjust and modulate the transmitter oscillator frequency: 1) Amplitude Modulation (AM), and 2) Frequency-Shift Keying (FSK). In AM, the transmitter oscillator frequency is impressed on a carrier, producing sidebands at frequencies above and below that of the carrier, without changing the instantaneous frequency of the carrier itself. In FSK, one shifts the frequency of the carrier over a range of a few hundred hertz. One frequency is called the mark and the other frequency is called the space. Various sets of standard mark/space FSK combinations are used in different communication services.

In accordance with one embodiment of the present invention, the RF transmitter 13 may form a feedback loop with the data generating chip 12. As may be seen from FIG. 1, a line 19 is coupled to an output of the RF transmitter 13 and to an input of the data generating chip 12. The line 19 will allow the data generating chip 12 to read the centerpoint frequency of the RF transmitter 13 in order to make further adjustments.

A variable capacitor circuit 16 is located internal to the data generating chip 12. The variable capacitor circuit 16 is coupled to a ground pin 18 and one of a plurality of function pins 14. The variable capacitor circuit 16 is used for adjusting and setting the centerpoint of the transmitter oscillator frequency.

Figure 2:
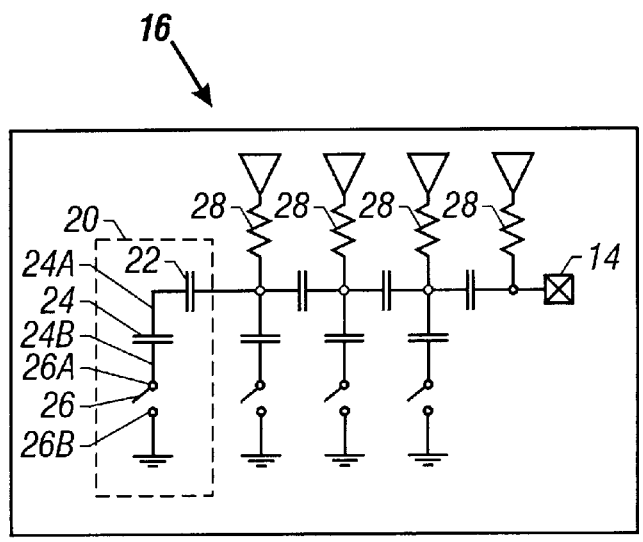
FIG. 2 is a simplified electrical schematic of one embodiment of the adjustable internal capacitor system used in the transmitter system depicted in FIG. 1.

Referring to FIG. 2 wherein like numerals and symbols represent like elements, one embodiment of the variable capacitor circuit 16 is shown. In this embodiment, the variable capacitor circuit 16 is a standard binary type variable capacitor circuit having a plurality of capacitor banks 20. Each capacitor bank 20 has two capacitors 22 and 24 and a switching circuit 26. The second capacitor has a first terminal 24A which is coupled to the first capacitor 22. The second terminal 24B of the second capacitor 24 is coupled to a first terminal 26A of the switching circuit 26. The second terminal 26B of the switching circuit 26 is coupled to ground (i.e., ground pin 18). The switching circuit 26 is used for activating and deactivating a respective capacitor bank 20.

The variable capacitor circuit 16 further has a pull-up resistor device 28 coupled to each capacitor bank 20. The pull-up resistor device 28 is used for preventing a negative voltage swing and for preventing floating nodes.

In operation, 1 to n number of capacitor banks 20 may be implemented. By opening and closing various switching circuits 26, one is able to activate 1 through n capacitors where n is the total number of capacitors in all of the capacitor banks 20. This will allow a user to fine tune and adjust the centerpoint of the transmitter oscillator frequency.

Referring to FIG. 2 wherein like numerals and symbols represent like elements with the exception of the use of "'" to designate an alternative embodiment, a second embodiment of the variable capacitor circuit 16' is shown. Like the embodiment shown in FIG. 2, the variable capacitor circuit 16' has a plurality of capacitor banks 20'. Each capacitor bank 20' is comprised of a single capacitor 30 and a switching circuit 26'. Each capacitor 30 has a first terminal 30A' which is coupled to the function pin 14'. The second terminal 30B' of the capacitor 30 is coupled to the first terminal 26A' of the switching circuit 26'. The second terminal 26B' of the switching circuit 26' is coupled to ground (i.e., ground pin 18 (FIG. 1).

Like the previous embodiment depicted in FIG. 2, the variable capacitor circuit 16' has a pull-up resistor device 28'. However, unlike the previous embodiment, only one pull-up resistor device 28' is required. The pull-up resistor device 28' is coupled to the function pin 14' and to the first terminal 30A of each capacitor 30. The pull-up resistor device 28' is used for preventing a negative voltage swing and for preventing floating nodes.

As in the previous embodiment, 1 to n number of capacitor banks 20' may be implemented. In the preferred embodiment of the present invention, each of the capacitors 30 will have different capacitance ratings. By opening and closing various switching circuits 26' one is able to generate different capacitance values thereby fine tuning and adjusting the centerpoint of the transmitter oscillator frequency.

Figure 3:
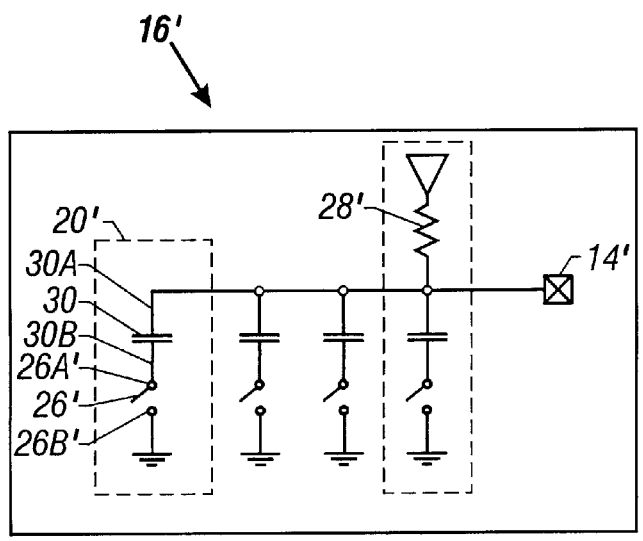
FIG. 3 is a simplified electrical schematic of a second embodiment of the adjustable internal capacitor system used in the transmitter system depicted in FIG. 1.
Figure 5:
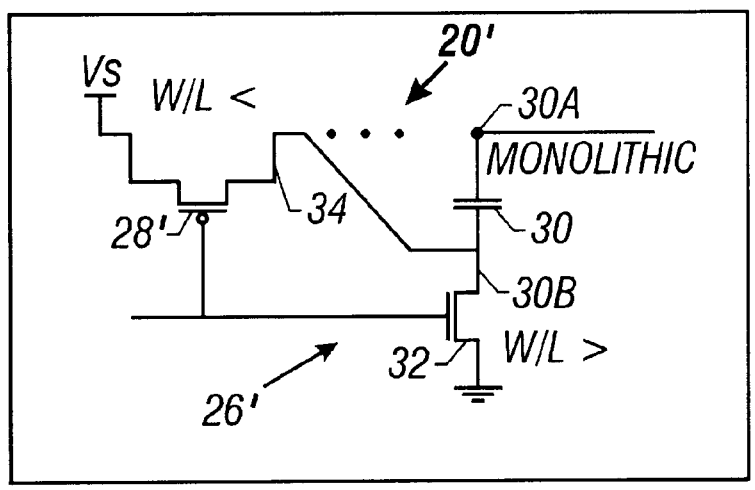
FIG. 5 is a simplified electrical schematic of one capacitor bank for the adjustable internal capacitor system depicted in FIG. 3.

Referring to FIG. 5, wherein like numerals and symbols represent like elements, an electrical schematic of one capacitor bank 20' of FIG. 3 is shown with the pull-up resistor device 28'. As may be seen from FIG. 5, the switching circuit 26' is implemented as an NMOS transistor 32. The NMOS transistor 32 has drain, gate, and source terminals. The drain terminal of the NMOS transistor 32 is coupled to the second terminal 30B of the capacitor 30. The gate terminal of the NMOS transistor 32 is coupled to the pull-up resistor 28, while the source terminal is coupled to ground.

The pull-up resistor device 28' is implemented as a PMOS transistor 34. The PMOS transistor 34 also has drain, gate, and source terminals. The source terminal of the PMOS transistor 34 is coupled to the second terminal 30B of the capacitor 30. The gate terminal of the PMOS transistor 34 is coupled to the gate terminal of the NMOS transistor 32. The drain terminal of the PMOS transistor 34 is coupled to a supply voltage. Optionally, the PMOS transistor 34 may be excluded in totality.

Figure 4:
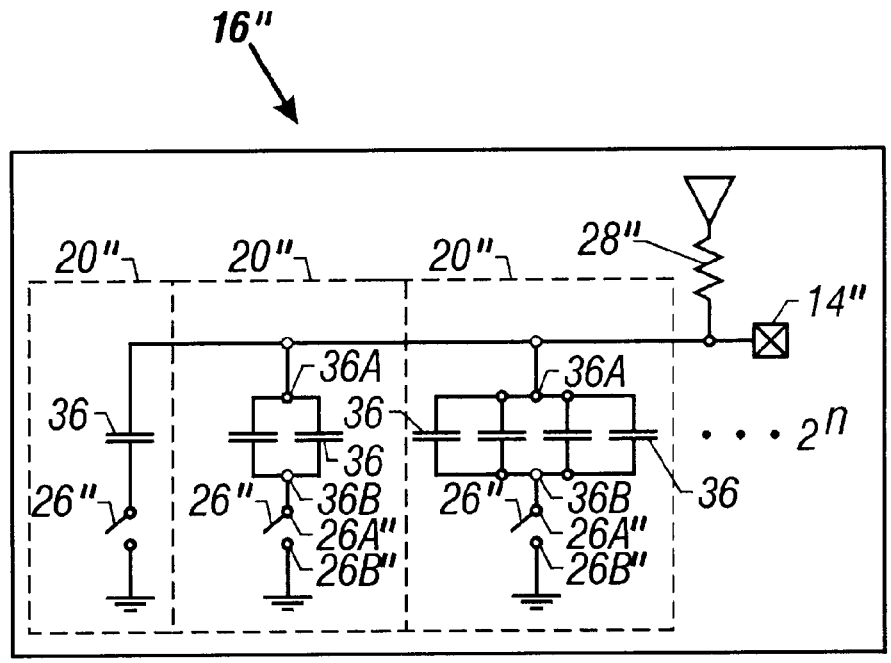
FIG. 4 is a simplified electrical schematic of a third embodiment of the adjustable internal capacitor system used in the transmitter system depicted in FIG. 1.

Referring to FIG. 4 wherein like numerals and symbols represent like elements with the exception of the use of "''" to designate an alternative embodiment, another embodiment of the variable capacitor circuit 16" is shown. In this embodiment, the variable capacitor circuit 16" is a weighted binary capacitor circuit. Each capacitor bank 20" of the weighted binary capacitor circuit has $2^n$ capacitors 36 where n is an integer greater than or equal to 0. Each of the $2^n$ capacitors 36 in each weighted capacitor bank 20" are coupled together in parallel. Each capacitor 36 has a first terminal 36A and a second terminal 36B wherein the first terminal 36A is coupled to the function pin 14" and the second terminal 36B is coupled to the switching circuit 26". In the preferred embodiment of the present invention, each weighted capacitor bank 20" uses a different integer for n. Like the previous embodiments, the switching circuit 26" has a first terminal 26A" and a second terminal 26B". The first terminal 26A" of is coupled to the second terminal of each of the $2^n$ capacitors 36 and the second terminal 26B" is coupled to ground. Each switching circuit 26" is used for activating and deactivating a corresponding weighted capacitor bank 20". The switching circuit 26" may also use a plurality of switches 26". If a plurality of switches are used, each of the $2^n$ capacitors 36 in each weighted capacitor bank 20" will have a single switch 26" coupled thereto.

When an individual capacitor bank 20" is activated, all of the switches 26" for each capacitor 36 in the active branch will be closed.

As in previous embodiments, the variable capacitor circuit 16" has a pull-up resistor device 28". The pull-up resistor device 28" is coupled to each weighted capacitor bank 20" and to the function pin 14". The pull-up resistor 28" is used for preventing a negative voltage swing and for preventing floating nodes.

In operation, any number of weighted capacitor banks 20" may be implemented. By opening and closing various switching circuits 26" one is able to activate a desired capacitance value. This will allow a user to fine tune and adjust the centerpoint of the transmitter oscillator frequency.

Figure 6:
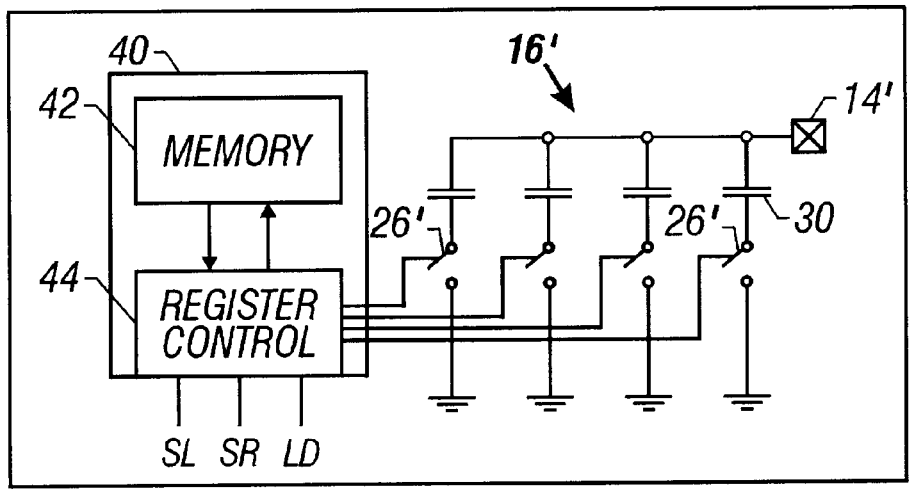
FIG. 6 is a simplified electrical schematic of one embodiment of a control system for adjusting the adjustable internal capacitor system.

A tuning circuit 40 (FIGS. 6 and 7) may be used to control the switching of the capacitor banks 20". The tuning circuit 40 is generally a digital control unit such as a microcontroller, microprocessor or some type of digital control logic. Referring to FIG. 6, wherein like numerals and symbols represent like elements, one embodiment of the tuning circuit 40 is shown. For discussion purposes, the tuning circuit 40 will be disclosed as being coupled to the variable capacitor circuit 16' shown in FIG. 3. However, the tuning circuit 40 may be used with any of the other variable capacitor circuits depicted in the Figures or variations of the variable capacitor circuits shown.

The tuning circuit 40 is coupled to each of the switching circuits 26' and is used for activating and deactivating each capacitor bank 20' by opening or closing the different switching circuits 26'. The tuning circuit 40 uses a memory device 42 for storing a desired setting for the variable capacitor circuit 16'. The memory device 42 will download this setting to a register 44. The register 44 will then open or close each switching circuit 26' based on the downloaded setting. For example, the memory device 42 may store a binary value. The binary value will be loaded into the register 44. Each bit in the register is coupled to and controls a separate switching circuit 26'. If a bit stores a 1, the corresponding switching circuit 26' will close. If a bit stores a 0, the corresponding switching circuit 26' will remain open.

Figure 7:
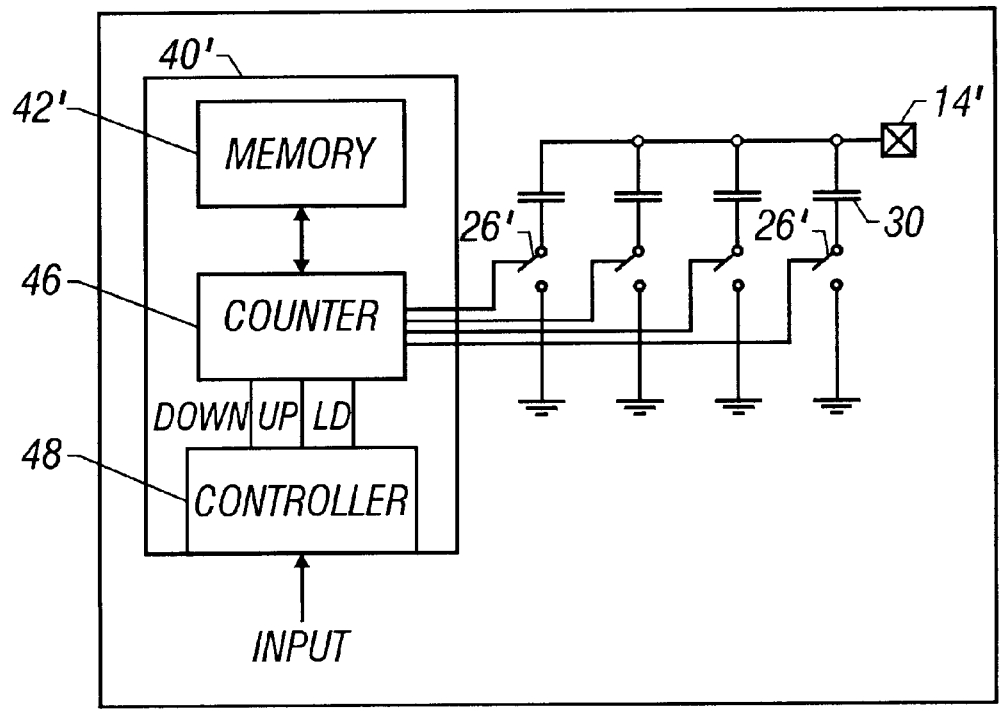
FIG. 7 is a simplified electrical schematic of a second embodiment of a control system for adjusting the adjustable internal capacitor system.

Referring to FIG. 7, wherein like numerals and symbols represent like elements, another embodiment of the tuning circuit 40' is shown. For discussion purposes, the tuning circuit 40' will be disclosed as being coupled to the variable capacitor circuit 16' shown in FIG. 3. However, the tuning circuit 40' may be used with any of the other variable capacitor circuits depicted in the Figures or variations of the variable capacitor circuits shown.

Like the previous embodiment, the tuning circuit 40' is coupled to each of the switching circuits 26' and is used for activating and deactivating each capacitor bank 20' by opening or closing the different switching circuits 26'. The tuning circuit 40' uses a memory device 42' for storing a desired setting for the variable capacitor circuit 16'. The memory device 42' will download this setting to a counter 46. The counter 46 will then open or close each switching circuit 26' based on the downloaded setting. For example, the memory device 42 may store a binary value. The binary value will be loaded into the register 44. Each bit in the register is coupled to and controls a separate switching circuit 26'. If a bit stores a 1, the corresponding switching circuit 26' will close. If a bit stores a 0, the corresponding switching circuit 26' will remain open. A controller 48 is further coupled to the counter 46. The controller 48 may be used to alter the setting of the counter 46. A user may send an input signal to the controller 48. This signal will change the current setting of the counter 46. By changing the current setting, different switching circuits 26' will be opened and closed thereby adjust the current centerpoint of the transmitter oscillator frequency. The new setting may then be uploaded and stored in the memory device 42' Thus, the next time the system 10 is activated, the new setting will be downloaded to the counter 46.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A transmitter system having an adjustable frequency stabilization internal capacitor circuit comprising, in combination:

a transmitter for generating and transmitting a transmitter oscillator frequency signal;

a data generating chip coupled to said transmitter and having a plurality of function pins for adjusting and controlling said transmitter oscillator frequency signal; and a variable capacitor circuit internal to said data generating chip and coupled to a ground pin and one of said plurality of function pins of said data generating chip for adjusting and setting a centerpoint of said transmitter oscillator frequency signal.

2. A transmitter system in accordance with claim 1 further comprising a tuning circuit coupled to said variable capacitor circuit for adjusting and setting said variable capacitor circuit.

3. A transmitter system in accordance with claim 1 further comprising pull-up circuit coupled to said variable capacitor circuit for preventing a negative voltage swing and for preventing floating nodes.

4. A transmitter system in accordance with claim 1 wherein said variable capacitor circuit is a binary capacitor circuit.

5. A transmitter system in accordance with claim 4 wherein said binary capacitor circuit comprises at least one capacitor bank.

6. A transmitter system in accordance with claim 5 wherein said at least one capacitor bank of said binary capacitor circuit comprises:

a first capacitor;

a second capacitor having a first terminal and a second terminal wherein said first terminal of said second capacitor is coupled to said first capacitor; and a switching circuit having a first terminal and a second terminal wherein said first terminal of said switching circuit is coupled to said second terminal of said second capacitor and said second terminal of said switching circuit is coupled to ground for activating and deactivating said at least one capacitor bank.

7. A transmitter system in accordance with claim 1 wherein said variable capacitor circuit comprises at least one capacitor bank.

8. A transmitter system in accordance with claim 7 wherein said at least one capacitor bank comprises:

a capacitor having a first terminal and a second terminal wherein said first terminal of said first capacitor is coupled to said one of said plurality of function pins; and a switching circuit having a first terminal and a second terminal wherein said first terminal of said switching circuit is coupled to said second terminal of said capacitor and said second terminal of said switching circuit is coupled to ground for activating and deactivating said at least one capacitor bank.

9. A transmitter system in accordance with claim 1 wherein said variable capacitor circuit is a binary weighted capacitor circuit.

10. A transmitter system in accordance with claim 9 wherein said binary weighted capacitor circuit comprises a plurality of weighted capacitor banks.

11. A transmitter system in accordance with claim 10 wherein each of said plurality of weighted capacitor banks comprises:

- $2^n$ capacitors where n is an integer greater than or equal to 0 and each weighted capacitor bank uses a different integer for n, each of said $2^n$ capacitors being coupled together in parallel and having a first terminal and a second terminal wherein said first terminal of each of said $2^n$ capacitors is coupled to said one of said plurality of function pins;
- a switching circuit having a first terminal and a second terminal wherein said first terminal of said switching circuit is coupled to said second terminal of each of said $2^n$ capacitors and said second terminal of said switching circuit is coupled to ground for activating and deactivating a corresponding weighted capacitor bank.

12. A transmitter system in accordance with claim 2 wherein said tuning circuit comprises:

- a memory device for storing a desired setting of said variable capacitor circuit; and
- a register coupled to said memory device and to said variable capacitor circuit for receiving said desired setting from said memory device and for adjusting and setting said variable capacitor circuit to said desired setting.

13. A transmitter system in accordance with claim 2 wherein said tuning circuit comprises:

- a memory device for storing a desired setting of said variable capacitor circuit;
- a register coupled to said memory device and to said variable capacitor circuit for receiving said desired setting from said memory device and for adjusting and setting said variable capacitor circuit to said desired setting; and
- a controller coupled to said register for adjusting a current setting of said register.

14. A transmitter system comprising, in combination:

- a transmitter for generating and transmitting a transmitter oscillator frequency signal;
- a data generating chip coupled to said transmitter and having a plurality of function pins for adjusting and controlling said transmitter oscillator frequency signal;
- a variable capacitor circuit internal to said data generating chip and coupled to a ground pin and one of said plurality of function pins of said IC transmitter chip for adjusting and setting a centerpoint of said transmitter oscillator frequency wherein said variable capacitor circuit comprises a plurality of capacitor banks;
- a tuning circuit coupled to each of said plurality of capacitor banks of said variable capacitor circuit for activating and deactivating each of said plurality of capacitor banks for adjusting and setting said variable capacitor circuit to set said centerpoint of said transmitter oscillator frequency;
- a pull-up circuit coupled to said variable capacitor circuit for preventing a negative voltage swing and for preventing floating nodes; and
- a switching circuit coupled to each of said plurality of capacitor banks of said variable capacitor circuit and to said tuning circuit for receiving a setting from said tuning circuit and for switching on and switching off each of said plurality of capacitor banks based on said setting from said tuning circuit for adjusting and setting said variable capacitor circuit to said centerpoint of said transmitter oscillator frequency.

15. A transmitter system in accordance with claim 14 wherein each of said plurality of capacitor banks comprises:

- a first capacitor; and
- a second capacitor having a first terminal and a second terminal wherein said first terminal of said second capacitor is coupled to said first capacitor and said second terminal is coupled to said switching circuit.

16. A transmitter system in accordance with claim 14 wherein each of said plurality capacitor banks comprises a capacitor having a first terminal and a second terminal wherein said first terminal of said first capacitor is coupled to said one of said plurality of function pins and said second terminal is coupled to said switching circuit.

17. A transmitter system in accordance with claim 14 wherein each of said plurality of capacitor banks comprises $2^n$ capacitors where n is an integer greater than or equal to 0 and each weighted capacitor bank uses a different integer for n, each of said $2^n$ capacitors being coupled together in parallel and having a first terminal and a second terminal wherein said first terminal of each of said $2^n$ capacitors is coupled to said one of said plurality of function pins and said second terminal of each of said $2^n$ capacitors is coupled to said switching circuit.

18. A transmitter system in accordance with claim 14 wherein said tuning circuit comprises:

- a memory device for storing a desired setting of said variable capacitor circuit; and
- a register coupled to said memory device and to said switching circuit for receiving said desired setting from said memory device and for sending a signal to said switching circuit to activate and deactivate each of said plurality of capacitor banks.

19. A transmitter system in accordance with claim 14 wherein said tuning circuit comprises:

- a memory device for storing a desired setting of said variable capacitor circuit;
- a register coupled to said memory device and to each of said plurality of capacitor banks of said variable capacitor circuit for receiving said desired setting from said memory device and for adjusting and setting said variable capacitor circuit to said desired setting; and
- a controller coupled to said register for adjusting and setting a current setting of said register.

* * * * *